United States Patent [19]

Kianian et al.

[11] Patent Number: 5,852,577
[45] Date of Patent: Dec. 22, 1998

[54] ELECTRICALLY ERASABLE AND PROGRAMMABLE READ-ONLY MEMORY HAVING A SMALL UNIT FOR PROGRAM AND ERASE

[75] Inventors: Sohrab Kianian, Los Altos; Dana Lee, Santa Clara, both of Calif.

[73] Assignee: Silicon Storage Technology, Inc., Sunnyvale, Calif.

[21] Appl. No.: 73,104

[22] Filed: May 5, 1998

[51] Int. Cl.$^6$ ..................................................... Q11C 13/00
[52] U.S. Cl. ................................ 365/185.23; 365/185.01; 365/185.1
[58] Field of Search ............................ 365/185.01, 185.1, 365/185.23, 230.01

[56] References Cited

U.S. PATENT DOCUMENTS

5,289,411  2/1994  Jeng et al. .
5,572,054  11/1996  Wang et al. .

Primary Examiner—Terrell W. Fears
Attorney, Agent, or Firm—Limbach & Limbach LLP; Ronald L. Yin

[57] ABSTRACT

A full programmable and erasable non-volatile floating gate memory array uses an array of memory cells arranged in a plurality of rows and columns. Each cell is of the type with a first region, a spaced apart second region and a channel region in between. A floating gate is disposed over and is insulated from a portion of the channel region and the second region. An electrically conductive gate has a first section disposed over and insulated from the first region and is disposed and is adjacent to the floating gate and is insulated therefrom and has a second section disposed over the floating gate and is insulated therefrom. The cells are arranged in rows with the second region for connection to a common line. The control gate of each of the memory cells is for connecting to a word line associated with the row. Each column is connected to the first region of the memory cells arranged in the column. The array has a plurality of first transistors interposed in each row for connecting the second regions of the memory cells arranged in each row to the common line. Each of the plurality of first transistors has an associated first portion of the memory cells in each row. Each of the first transistor can be activated by an activating means to program the memory cells of the associated first portion.

14 Claims, 5 Drawing Sheets

FIG. 1

(Prior Art)

| Fox | Cell 1 10aa1 | Fox | | Fox | Cell 3 10ac1 |

36a2

| Fox | | Fox | Cell 2 10ab2 | Fox | |

*FIG. 7A*

| Fox | Cell 1 10aa1 | Fox | Cell 3 10ac1 | Fox |

36a2

| | Fox | Cell 2 10ab2 | Fox | Cell 4 10ad2 |

*FIG. 7B*

ELECTRICALLY ERASABLE AND PROGRAMMABLE READ-ONLY MEMORY HAVING A SMALL UNIT FOR PROGRAM AND ERASE

TECHNICAL FIELD

The present invention relates to a memory array of non-volatile floating gate memory cells of the source side injection type having a floating gate for the storage of charges for the cell. More particularly, the present invention relates to such an array having a small unit, such as a byte, which can be programmed and erased.

BACKGROUND OF THE INVENTION

Non-volatile floating gate memory cells, arranged in an array of a plurality of rows and columns are well known in the art. One example of a type of non-volatile floating gate memory cell is a source side injection memory cell. See, for example, the memory cell disclosed in U.S. Pat. No. 5,572,054 which is incorporated herein by reference.

Figure 1:
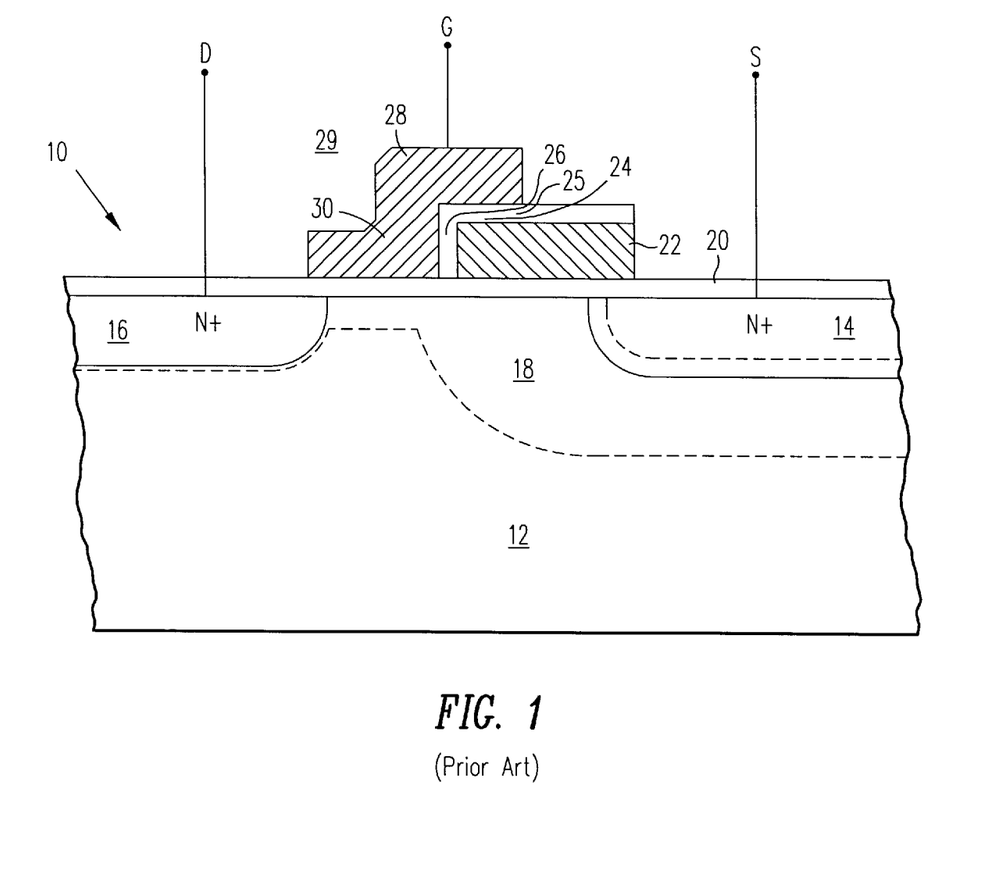
FIG. 1 is a cross sectional side view of a memory cell of the prior art as disclosed in U.S. Pat. No. 5,572,054, for use in the memory array of the present invention.

Referring to FIG. 1, there is shown a cross-sectional view of a non-volatile floating gate memory cell, as disclosed in U.S. Pat. No. 5,572,054. The memory cell 10 has a first region 16, a spaced apart second region 14, in a substrate 12. A channel region 18 separates between the first region 16 and the second region 14. A floating gate 22 is disposed over and is insulated from a portion of the channel region 18 and from a portion of the second region 14. An electrically conductive control gate 29 has a first section 30 disposed over and insulated from the first region 16 and disposed adjacent to the floating gate 22 and insulated therefrom, and a second section 28 disposed over the floating gate 22 and insulated therefrom.

The memory cells 10 are typically arranged In a plurality of rows and columns. See, for example, U.S. Pat. No. 5,289,411, which is incorporated herein by reference.

Figure 2:
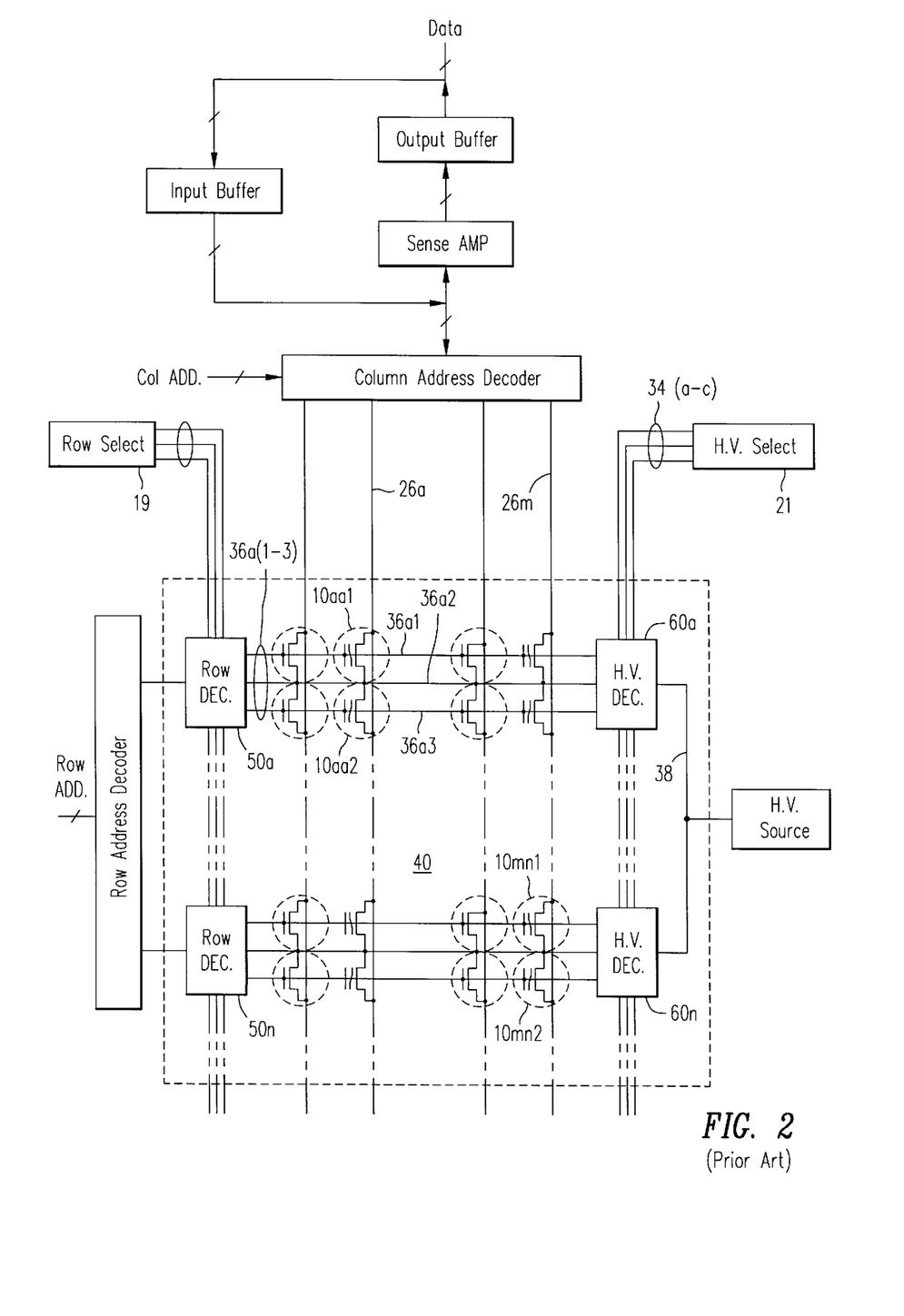
FIG. 2 is a schematic block level diagram of a circuit of the prior art showing one use of the memory cell, shown in FIG. 1, arranged in an array to operate in a "flash" mode wherein all of the cells arranged in each row are erased simultaneously.

Referring to FIG. 2, there is shown a schematic diagram of a memory array 40, as disclosed in U.S. Pat. No. 5,289,411, using the memory cells 10 shown in FIG. 1. The memory array 40 has a plurality of column lines 26(a–m). Each column line 26 is connected to the first region 16 of the memory cells 10 arranged in that column. The memory array 40 also comprises a plurality of word lines, e.g. 36a1 and 36a3, with each word line connected to the control gate 29 of the memory cells 10 located in that row. Further, within each row there is a common line, e.g. 36a2 which connects to the second region 14 of the memory cells 10 in the memory array 40. The arrangement of the memory cells 10 in such an array 40 is typically referred to as a flash memory array because the operation of erase occurs by erasing all the memory cells 10 located in the same row. During the erase operation, as disclosed in U.S. Pat. No. 5,572,054, the second region 14 of each of the memory cells 10 is connected to a ground potential. A high positive potential, such as +15 volts is supplied to the control gate terminal 29 of each of the affected memory cells 10 by the voltage supplied from the selected word line. Finally, the first region 16 is permitted to be floating. In operation of the memory array 40, this means that for an affected row of memory cells, e.g. 36x, the corresponding word lines, 36x1 and 36x3 are connected to a source of high potential such as +15 volts. The corresponding source line, 36ax2 is connected to ground potential. All the memory cells 10 in the row 36x are then erased simultaneously. While flash memory devices are useful in that erase operation occurs quickly for a large number of cells, in certain applications it is not desirable to erase an entire row of memory cells. In certain applications it is desirable to erase only certain particular cell or group of cells within a particular row and to program these erased cells.

SUMMARY OF THE INVENTION

The present invention envisions two embodiments to accomplish the foregoing objective. In the present invention, an array of non-volatile floating gate memory cells are arranged in a plurality of rows and columns. Each memory cell is of the type which has a first region, a spaced apart second region, with a channel region therebetween. A floating gate is disposed over and insulated from a portion of the channel region and from a portion of the second region. An electrically conductive control gate has a first section disposed over and insulted from the first region and disposed adjacent to the floating gate and insulated therefrom, and a second section disposed over the floating gate and insulated therefrom. The array comprises a plurality of column lines with each column line connected to the first region of memory cells arranged in a column. The array further comprises a plurality of word lines with each word line for connecting to the control gate of the memory cells in a row. In addition, the memory array comprises a plurality of common lines with each common line for connecting to the second region of the memory cells in a row of the array.

In a first embodiment, a plurality of first transistor means is interposed in each row for connecting the second regions of the memory cells arranged in each row to the common line. Each of the plurality of first transistor means is associated with a portion of memory cells in each row. Also included is means for activating one of the plurality of transistor means to program the memory cells of the associated portion.

In another embodiment of the present invention, a plurality of transistor means is interposed in each row for connecting the associated word line to the control gate of the memory cells arranged in each row. Each of the plurality of transistor means has an associated portion of memory cells in each row. The memory array also comprises means for activating one of the plurality of transistor means to program or to erase the memory cells of the associated portion.

DETAILED DESCRIPTION OF THE DRAWINGS

Figure 3:
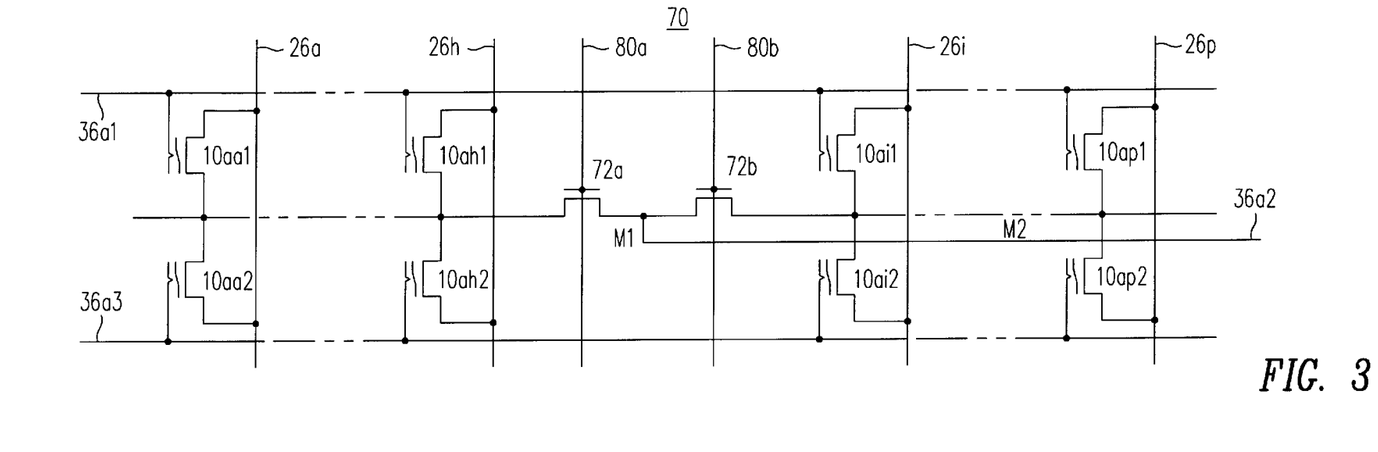
FIG. 3 is a schematic circuit diagram of a first embodiment of the present invention for use in the memory array shown in FIG. 2, wherein only portions of the memory cells arranged in the same row can be erased or programmed simultaneously.

Referring to FIG. 3, there is shown a first embodiment of a circuit 70 suitable for use with the memory array 40 shown in FIG. 2. Similar to the array 40 shown in FIG. 2, the circuit 70 comprises a plurality of column lines 26($a$–$p$) and a plurality of row lines, e.g. 36$a$1 and 36$a$3. A plurality of memory cells 10 of the type shown on FIG. 1 are arranged in the same row. Each of the column lines 26 is connected to the first region 16 of the memory cells 10 arranged in the particular column. Each of the plurality of word lines, e.g. 36$a$1 and 36$a$3 is for connection to the control gate 29 of the memory cells 10 arranged in that row. Finally, a common line 36$a$2 connects to the second region 14 of the memory cells 10 arranged in that row. As is evident from FIG. 3, two rows of memory cells 10 share the same common line 36$a$2. A plurality of first transistors 72$a$ and 72$b$ are interposed in each row for connecting the second region 14 of the memory cells 10 arranged in each row to the common line 36$a$2. Each of the transistor 72$a$ and 72$b$ is associated with a portion of memory cells 10 in each of the rows. Thus, for example, as shown in FIG. 3, first transistor 72$a$ is associated with eight memory cells 10$aa$1 . . . 10$ah$2, connected to the word line 36$a$1 and eight memory cells 10$aa$2 . . . 10$ah$2, connected to word line 36$a$3. Similarly, first transistor 72$b$ is associated with eight memory cells 10$ai$1 . . . 10$ap$1, connected to word line 36$a$1 and eight memory cells 10$ai$2 . . . 10$ap$2, connected to word line 36$a$3.

Each of the first transistors 72$a$ and 72$b$ can be an MOS transistor having two source/drain regions. Since the second region 14 of the memory cells 10 are made of diffusion lines in the substrate 12, the connection between the second region 14 of the memory cells 10 and a first source/drain of the first transistor 72$a$ would be in diffusion. A metal 1 via contact connects a metal 2 line, which connects to the voltage source for common line 36$a$2, to the diffusion region connecting first transistors 72$a$ and 72$b$.

Each of the first transistors 72$a$ and 72$b$ has a gate terminal. A select column line 80$a$ and 80$b$ connects to the gate of the first transistors 72$a$ and 72$b$ respectively. Activation of signal along the corresponding select column line 80$a$ or 80$b$ will "turn on" the associated first transistors 72$a$ or 72$b$.

In operation of the array 40 with the circuit 70, the voltage applied to the various components are as follows:

During erase, all of the column lines 26($a$–$p$) are held at floating. The voltage supplied to the common line 36$a$2 of the particular row is at approximately +7.5 volts. The associate word line, e.g. 36$a$1 is connected to a high positive potential, such as +15 volts. For the selected portion of the memory cells 10 in the row 36$a$ which is to be erased, the associated select column line, 80$a$, is held at ground or floating. For all of the unselected memory cells 10 in a row 36$a$, the select column line of the associated transistors, e.g. 80($b$–$x$) are held at approximately 7.5 volts +Vth. As a result, the voltage applied to the memory cells 10 in the selected portion of row 36$a$ are as follows:

First region 16: floating
Control gate 29: +15 volts
Second region 14: ground

For these selected memory cells 10, as disclosed in U.S. Pat. No. 5,572,054, the voltage differential between second region 14 and the control gate 29 is sufficient to cause Fowler-Nordheim tunneling of the electrons from the floating gate to the control gate 29. For all memory cells 10 in the same row but not selected, the voltages to the various portions of the memory cell 10 are as follows:

First region 16: floating
Control gate 29: +15 volts
Second region 14: 7.5 volts.

For these unselected memory cells 10, the voltage differential between the second region 14 and the control gate 29 is not enough to cause Fowler-Norheim tunneling of the electrons from the floating gate 22 onto the control gate 29. As a result, the floating gate 22 is not erased.

During programming, the voltage supplied to the column lines 26 of the non-selected memory cells is held at floating. For the particular memory cell 10 within the portion which is selected but which is not programmed (or maintained in the erase state), the associate column line is also held floating. All the rest of the column lines in the selected portion to be programmed are held at aground The word line is connected to +2 volts. The select column line 80$a$ for the portion of the memory cells 10 to be programmed is connected to +11 volts +Vth. All of the select column lines 80($b$–$x$) associated with the non-select cells 10 are held at ground or floating. As a result, the voltages applied to the various terminals in the memory cell 10 are as follows:

For the memory cells that are not selected
First region 16: ground or floating
Control gate 29: +2 volts
Second region 14: ground or floating For each of the bits within the selected portion that is to be programmed,
First region 16: 0 volts
Control gate 29: +2 volts
Second region 14: +11 volts For the memory cells 10 within the selected portion which is not to be programmed but which is to be maintained at the erased state:
First region 16: float
Control gate 29: +2 volts
Second region 14: +11 volts During read, all of the column lines connected to the memory cells 10 of the selected portion are held at +2 volts. All of the column lines of the non-selected portion are held at floating. The common line 36$a$2 is connected to ground. The word line 36$a$1 is connected to +5 volts. The select column line 80$a$ connected to the portion of the memory cells 10 which is to be read is connected to +5+Vth. The select column 80$b$ connected to the transistors of all the non-selected memory cells are held at ground. As a result, the voltages to the various terminals of the memory cell 10 in the selected portion as follows:

First region 16: ground
Control gate 29: +5
Second region 14: +2

The voltages to the terminals of the memory cells 10 in the non-selected portion of the same row are as follows:

First region 16: float

Control gate 29: +5

Second region 14: float

Figure 4:
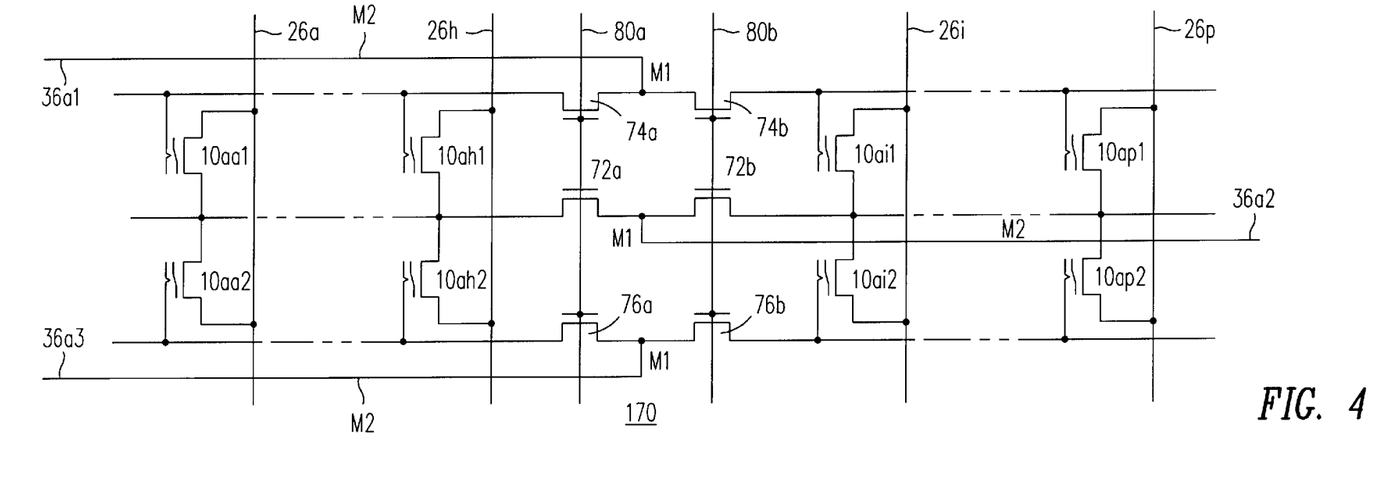
FIG. 4 is a schematic circuit diagram of a second embodiment of the present invention for use in the memory array shown in FIG. 2, wherein only portions of the memory cells arranged in the same row can be erased or programmed simultaneously.

Referring to FIG. 4 there is shown a second embodiment of a circuit 170 for use with the memory array 40, shown in FIG. 2. The second embodiment 170 is similar to the first embodiment 70 except with the addition of transistors 74(a–b) and 76(a–b) to connect the control gates 29 of the memory cells of each portion within a row to the respective word line 36a1 or 36a3. Thus, a third transistor 74a connects the control gate 29 of the memory cells 10aa1–10ah1 to the word line 36a1. The fourth transistor 74b connects the control gate 29 of the memory cells 10ai1–10ap1 to the word line 36a1. Similarly, fifth transistors 76a connects the word line 36a3 to the control gate 29 of the memory cells 10aa2–10ah2. A sixth transistor 76b connects the word line 36a3 to the control gate 29 of the memory cells 10ai–10ap2.

Each of the transistor 74a, 74b and 76a in 76b is similar to transistor 72a and 72b and each can be made out of MOS transistors. The source/drain region connecting the third and fourth transistor 74a and 74b is made out of diffusion and is connected through a via contact to metal 1 layer which is then connected to the metal 2 layer connecting to the word line 36a1. Similarly, the source/drain region connecting the transistors 76a and 76b is connected to a metal 1 layer through a via hole to a metal 2 layer to the word line 36a3.

The gates of transistor 74a and 76a are also connected to the first select column 80a which is also connected to the gate of first transistor 72a. The gates of transistors 74b and 76b are also connected to the second select column line 80b which is, of course, also connected to the gate of the first transistor 72b.

In operation, during erase, all the column lines 26a–p are held floating. The common line 36a2 is connected to ground. The selected word line, e.g. 36a1 is connected to a positive potential such as +15 volts. The select column 80a associated with the portion of the memory cells 10 to be erased is raised to +15 volts +Vth. The select column 80b associated with non-selected memory cells 10 in the same row is connected to ground or is held floating. Thus, the voltages on the terminals of the memory cells in the selected portion are as follows:

First region 16: floating

Control gate 29: +15 volts

Second region 14: ground

For the non-selected memory cells 10 in the same row, the voltages to the various terminals as follows:

First region 16: floating

Control gate 29: floating or ground

Second region 14: floating

During the programming operation, the following voltages are applied. All of the column lines associated with the non-select portion of the memory cells 10 in the row are held floating. The column line for the memory cell 10 in the selected portion, which is not to be programmed or maintain in erased state is also held floating. The column lines for the memory cells 10 in the selected portion which are to be programmed are connected to ground. Common line 36a2 is connected to +11 volts. The particular selected word line, e.g. 36a1 is connected to +2 volts. The select column line, e.g. 80a associated with the selected memory cells 10 is connected to +11 volts +vth. The select column line associated with the non-selected memory cells 10 in that same row are held at ground or in a floating condition. As a result, the voltages on the various terminals of the memory cells 10 in the non-selected portions are as follows:

First region 16: floating

Control gate 29: floating

Second region 14: floating or ground

For the memory cells 10 in the selected portion, which are to be maintained in the erase state, the voltages on the various terminals as follows:

First region 16: floating

Control gate 29: +2 volts

Second region 14: +11 volts

For the memory cells 10 in the selected portion which are to be programmed, the voltages on the various terminals are as follows:

First region 16: ground

Control gate 29: +2 volts

Second region 14: +11 volts

During read operation, all of the column lines associated with the memory cells of the selected portion are connected to +2 volts. All of the column lines associated with the non-selected memory cells are held floating. The common line is connected to ground. The particular word line is connected to +5 volts. The select column line 80a for the transistors associated with the memory cells 10 of the selected portion are at +5 volts. The select column line for the transistors associated with all the non-selected memory cells is held at ground. As a result, the voltages applied to the terminals of the non-selected memory cells are as follows:

First region 16: floating

Control gate 29: floating or ground

Second region 14: floating or ground

For the memory cells 10 in the portion of the row which are selected to be read, the voltages on the various terminals are as follows:

First region 16: +2 volts

Control gate 29: +5 volts

Second region 14: ground

Figure 5:
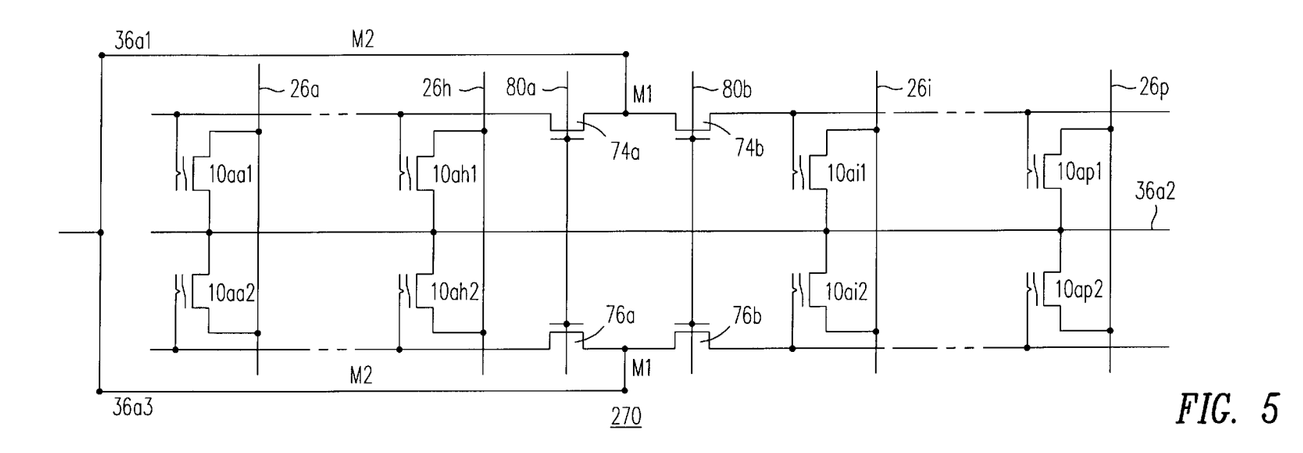
FIG. 5 is a schematic circuit diagram of a third embodiment of the present invention for use in the memory array shown in FIG. 2, wherein only portions of the memory cells arranged in the same row can be erased or programmed simultaneously.

Referring to FIG. 5 there is shown a third embodiment of a circuit 270 for use with the memory array 40 shown in FIG. 2. The circuit 270 is similar to the circuit 170 shown in FIG. 4 except that the first transistor 72a and 72b are eliminated. Thus, the common line 36a2 is connected directly to the second region 14 of all the memory cells 10 in that same row. In addition, the two word lines 36a1 and 36a3 which share the same common line 36a2 are connected together. In operation, the circuit 270 performs as follows. During erase, the voltages applied to the various terminals of the memory cells 10 which are selected within the row 36a are as follows:

First region 16: float

Control gate 29: +15 volts

Second region 15: ground

Since the two row lines 36a1 and 36a3 share the same common line 36a2 and are electrically connected together, the memory cells 10 which are of the selected portion include not only memory cells 10aa1–10ah1, but also memory cells 10aa2–10ah2.

As for the memory cells 10 in the non-selected portion, which include memory cells 10ai1–10ap1 and memory cells 10ai2–10ap2, the voltages on the various terminals are as follows:

First region 16: floating

Control gate 29: ground or floating

Second region 14: ground or floating

During programming, the column lines connected to the memory cells 10 in the selected portion which are to be programmed are grounded. The column lines to the memory cells in the selected portion which are not to be programmed and are to be maintained in the erase state are connected to +5 volts. In addition, the column lines to the memory cell 10 of the non-selected portion are held at +5 volts. The voltage on the first select line 80*a* is at +5 volts. The voltage on the second select column line 80*b* associated with the non-selected memory cells 10 is at ground. The common line 36*a*2 is connected to a +11 volts. The voltage to the word lines 36*a*1 and 36*a*3 which are connected in common is at +2 volts. For the memory cells in the non-selected portion, the voltages on the various terminals are as follows:

First region 16: +5 volts

Control gate 29: 0 volt

Second region 14: +11 volts

For the memory cells 10 in the selected portion which are not to be programmed and to remain in their erase state, the voltages on the various terminals are as follows:

First region 16: +5 volts

Control gate 29: +2 volts

Second region 14: +11 volts

Finally, for the memory cells 10 in the select portion which are to be programmed, the voltages on the terminals are as follows:

First region 16: ground

Control gate 29: +2 volts

Second region 14: +11 volts

During read, the column lines to the memory cells of the selected portion are all connected to +2 volts. The voltages to the column lines in the non-selected portion are held at ground or floating. The common line 36*a*2 is connected to ground. The voltage to the word lines 36*a*1 and 36*a*3 is maintained at +5 volts. In addition, the first select column line 80*a* associated with the portion of memory cells 10 which is selected, is at +5+Vth volts. The second column line 80*b*, associated with memory cells which are not selected, is at ground. Thus, during read, the voltages applied to the terminals of the memory cells 10 of the selected portion are as follows:

First region 16: +2 volts

Control gate 29: +5 volts

Second region 14: ground

The voltages applied to the terminals of the memory cells 10 of the non-selected portion are as follows:

First region 16: ground or floating

Control region 29: ground or floating

Second region 14: ground

From the foregoing, it can be seen that with the circuit 270, whether the operation is read, program or erase, two memory cells 10 connected to the same column line 26 and sharing the same common line 36*x* and connected to the two word lines 36*x*1 and 36*x*3 which border the same common line 36*x*2 are in operation simultaneously at all times.

Figure 6:
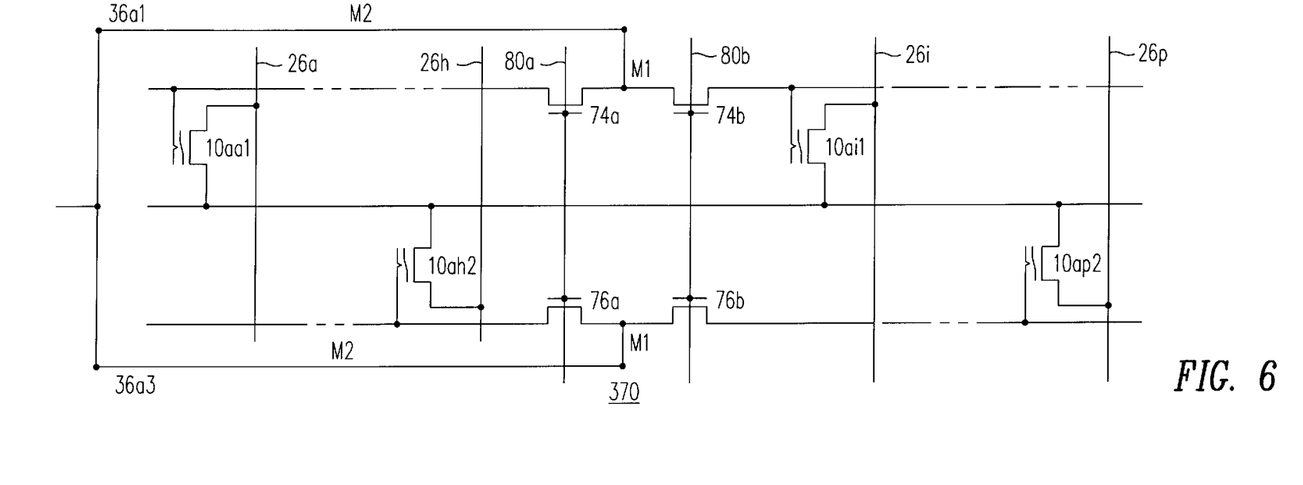
FIG. 6 is a schematic circuit diagram of a fourth embodiment of the present invention for use in the memory array shown in FIG. 2, wherein only portions of the memory cells arranged in the same row can be erased or programmed simultaneously.

Referring to FIG. 6, there is shown a schematic diagram of a fourth embodiment of a circuit 370 for use with the memory array 40. In the fourth embodiment of the circuit 370, this circuit is similar to the circuit 270 shown in FIG. 5, except that only one memory cell 10 is connected to each column in each "row", where a "row" is defined by one common line 36*x*. Thus, only one cell 10 is affected during read, program or erase. The memory cells 10 which are in the selected portion comprise the memory cells 10*aa*1, 10*ab*2, 10*ac*1, 10*ad*2 . . . 10*ah*2. Similarly, in the non-selected portion, the memory cells 10 are alternatingly staggered between connecting to the word line 36*a*1 and to the word line 36*a*3, which are of course, ultimately electrically connected together. The operation for the circuit 370 shown in FIG. 6 is identical to the operation of the circuit 270 shown in FIG. 5 with the same voltages affecting the terminals of the memory cells in the selected portion as well as the non-selected portion during the operations of read, program and erase.

Figure 7A:
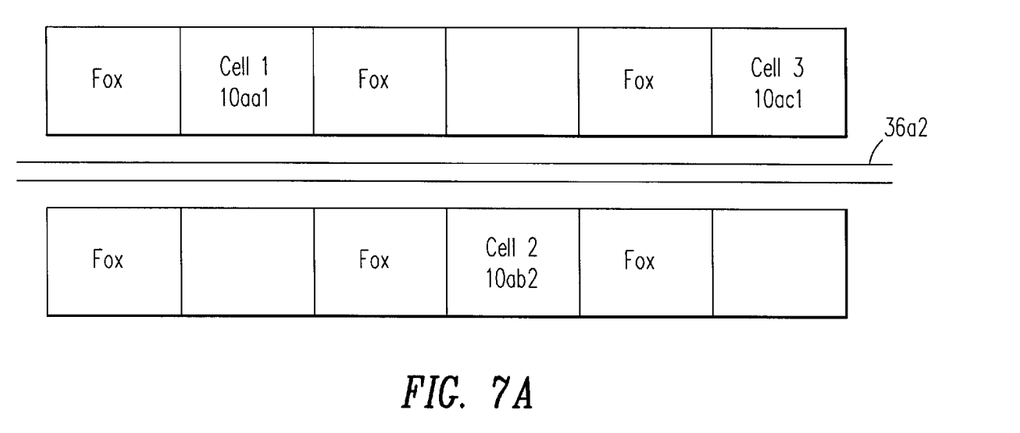
FIG. 7a is a topological plan view of a first layout of the fourth embodiment shown in FIG. 6.

Referring to FIG. 7*a*, there is shown a topological plan view of a first layout for the memory cells 10 for the embodiment of the circuit 370 shown in FIG. 6. As is well known in the art, each memory cell 10 comprising of a floating gate transistor, is isolated from one another in the lateral row direction by field oxide (labeled as FOX) which is an insulating material. Thus, memory cells 10*ax*1 which are aligned in a row associated with the row line 36*a*1 has alternatingly spaced regions for the memory cell 10 and the field oxide. However, since the memory cell 10*ab*1 has been eliminated, a "blank" region is indicated. Similarly, the memory cells 10 aligned in a row associated with the word line 36*a*3 have alternating field oxide regions and memory cell regions. However, since some of the memory cell regions are not used, they are left blank. Thus the region opposite memory cell 10*aa*1 (opposite in a column direction) is left blank because the memory cell 10*aa*2 has been eliminated. As can be seen, while the layout of the memory cells 10, shown in FIG. 7*a* is consist with the circuit 370, space is wasted by the regions left "blank".

Figure 7B:
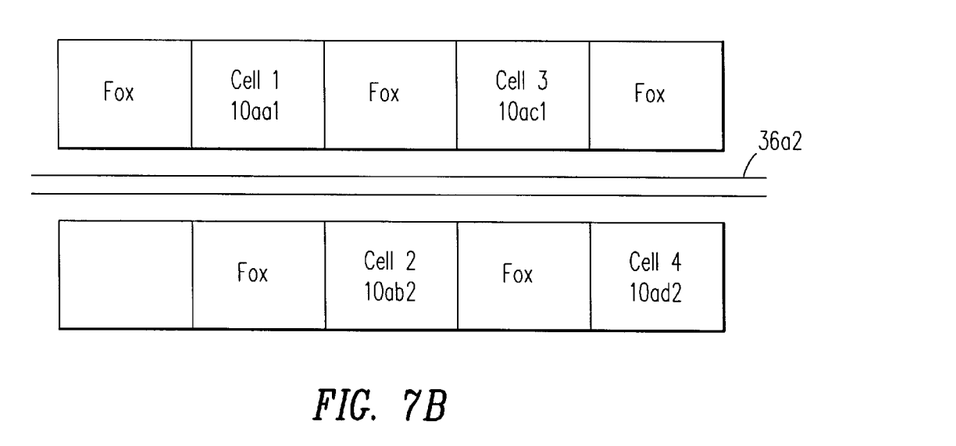
FIG. 7b is a topological plan view of a second layout of the fourth embodiment shown in FIG. 6.

Referring to FIG. 7*b*, there is shown another embodiment of a layout of the memory cells 10 in accordance with the circuit 370. This layout is similar to the layout shown in FIG. 7*a* except each memory cell, e.g. memory cell 10*ab*2, associated with a word line, e.g. 36*a*3, is placed opposite (in the column direction) to a field oxide region within the row of memory cells 10*ax*1 associated with the word line 10*a*1. Within each row, however, each memory cell 10 continues to be laterally bounded by field oxide regions. In this manner, the "blank" regions shown in FIG. 7*a* have been eliminated thereby increasing the utilization of the space in a silicon substrate.

What is claimed is:

1. In an array of non-volatile floating gate memory cells arranged in a plurality of rows and columns with each cell of the type having a first region, a spaced apart second region, with a channel region therebetween, a floating gate disposed over and insulated from a portion of said channel region and from a portion of said second region, an electrically conductive control gate having a first section disposed over and insulated from said first region and disposed adjacent to said floating gate and insulated therefrom and a second section disposed over said floating gate and insulated therefrom, said array comprising:

a plurality of column lines, each column line connect to the first region of memory cells arranged in a column;

a plurality of word lines, each word line for connecting to the control gate of memory cells in a row;

a common line for connecting to the second region of the memory cells in said array;

a plurality of first transistor means interposed in each row for connecting the second regions of the memory cells arranged in each row to the common line, each of said plurality of first transistor means having an associated first portion of memory cells in each row;

means for activating one of said plurality of first transistor means to program the memory cells of the associated first portion.

2. The array of claim 1 further comprising:

a plurality of second transistor means interposed in each row for connecting the associated word line to the control gate of the memory cells arranged in each row; each of said plurality of second transistor means having an associated second portion of memory cells in each row.

3. The array of claim 2 wherein said first portion and said second portion of memory cells in each row is the same.

4. The array of claim 3 wherein said means for activating one of said plurality of first transistor means to program the memory cells of the associated first portion, also activates one of said plurality of second transistor means associated with said same memory cells of the associated first portion.

5. The array of claim 4 wherein said activating means activates said one of said first transistor means and one of said second transistor means to erase the memory cells of the associated first portion.

6. The array of claim 1 wherein said activating means further activates one or more of said plurality of first transistor means to inhibit the erasure of the memory cells associated with the one or more of said plurality of first transistor means.

7. In an array of non-volatile floating gate memory cells arranged in a plurality of rows and columns with each cell of the type having a first region, a spaced apart second region, with a channel region therebetween, a floating gate disposed over and insulated from a portion of said channel region and from a portion of said second region, an electrically conductive control gate having a first section disposed over and insulated from said first region and disposed adjacent to said floating gate and insulated therefrom and a second section disposed over said floating gate and insulated therefrom, said array comprising:

a plurality of column lines, each column line connect to the first region of memory cells arranged in a column;

a plurality of word lines, each word line for connecting to the control gate of memory cells in a row;

a common line for connecting to the second region of the memory cells in said array;

a plurality of transistor means interposed in each row for connecting the associated word line to the control gate of the memory cells arranged in each row; each of said plurality of transistor means having an associated portion of memory cells in each row;

means for activating one of said plurality of transistor means to program or to erase the memory cells of the associated portion.

8. The array of claim 7 wherein a word line is associated with each row of memory cells; and with pairs of adjacent word lines electrically connected.

9. The array of claim 8 wherein said activating means activates simultaneously portions of memory cells in a pair of adjacent rows associated with a pair of adjacent word lines that are electrically connected.

10. The array of claim 9 wherein each column line is connected to the first region of a pair of memory cells in rows associated with a pair of adjacent word lines that are electrically connected.

11. The array of claim 9 wherein each column line is connected to the first region of a single memory cell in rows associated with a pair of adjacent word lines that are electrically connected.

12. The array of claim 11 wherein a memory cell in each row is bordered by isolation material.

13. The array of claim 12 wherein a memory cell in a row borders a memory cell in an adjacent row.

14. The array of claim 12 wherein a memory cell in a row borders isolation material in an adjacent row.

* * * * *